(12) United States Patent
Takakura et al.

(10) Patent No.: US 6,895,664 B2
(45) Date of Patent: May 24, 2005

(54) METHOD OF MAKING AN OPTICAL COUPLING DEVICE

(75) Inventors: Hideya Takakura, Nara (JP); Kazuo Kusuda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 90 days.

(21) Appl. No.: 10/270,005

(22) Filed: Oct. 15, 2002

(65) Prior Publication Data

US 2003/0079895 A1 May 1, 2003

(30) Foreign Application Priority Data

Oct. 25, 2001 (JP) ........................................ 2001-328040

(51) Int. Cl.⁷ .............................................. H01R 43/00
(52) U.S. Cl. .......................... 29/827; 29/832; 174/52.4; 438/25
(58) Field of Search .......................... 29/827, 832, 840, 29/830; 174/52.4; 438/25

(56) References Cited

U.S. PATENT DOCUMENTS 5,049,527 A * 9/1991 Merrick et al.
5,802,709 A * 9/1998 Hogge et al.

FOREIGN PATENT DOCUMENTS

| JP | 6-237010 A | 8/1994 |
| JP | 7-254728 A | 10/1995 |

* cited by examiner

Primary Examiner—Carl J. Arbes
(74) Attorney, Agent, or Firm—Birch, Stewart, Kolasch & Birch, LLP

(57) ABSTRACT

A lead frame of an optical coupling device of the present invention is so arranged that (a) a light-emitting side section in which a plurality of header sections for mounting thereon the light-emitting elements are aligned and (b) a light-receiving side section in which a plurality of header sections for mounting thereon the light-receiving element are aligned, and (c) a connecting section for connecting the light-emitting side section and the light-receiving side section in parallel into one body. The light-emitting side section and the light-receiving side section are integrated via a connecting section at which a V groove is formed for facilitating the folding of the lead frame. As a result, it is possible to provide a low-cost lead frame of an optical coupling device with a small number of components can be realized, in a simplified manner, and a manufacturing method of the optical coupling device.

23 Claims, 16 Drawing Sheets

※1 MODEL DIAGRAM

LEAD FRAME MOUNTED WITH THE LIGHT-EMITTING ELEMENT AND THE LIGHT-RECEIVING ELEMENT

FOLDING THE LEAD FRAME SO THAT THE LIGHT-RECEIVING ELEMENT AND THE LIGHT-EMITTING ELEMENT FACE EACH OTHER

FIG. 12 (a)

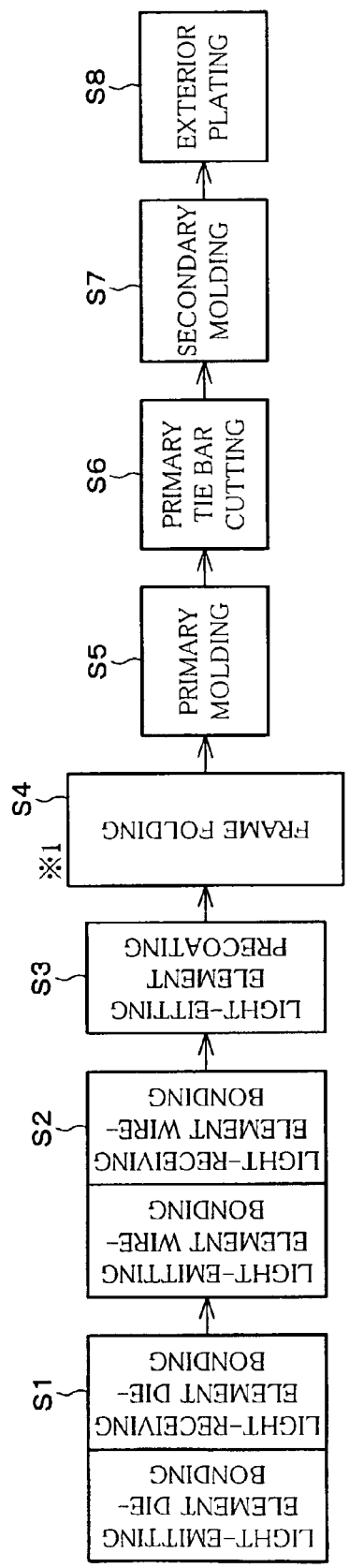

S1 LIGHT-EMITTING ELEMENT DIE-BONDING / LIGHT-RECEIVING ELEMENT DIE-BONDING
S2 LIGHT-EMITTING ELEMENT WIRE-BONDING / LIGHT-RECEIVING ELEMENT WIRE-BONDING
S3 LIGHT-EMITTING ELEMENT PRECOATING
S4 FRAME FOLDING ※1
S5 PRIMARY MOLDING
S6 PRIMARY TIE BAR CUTTING
S7 SECONDARY MOLDING
S8 EXTERIOR PLATING

FIG. 12 (b)

※1 MODEL DIAGRAM

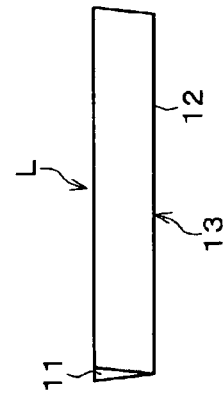

LEAD FRAME MOUNTED WITH THE LIGHT-EMITTING ELEMENT AND THE LIGHT-RECEIVING ELEMENT

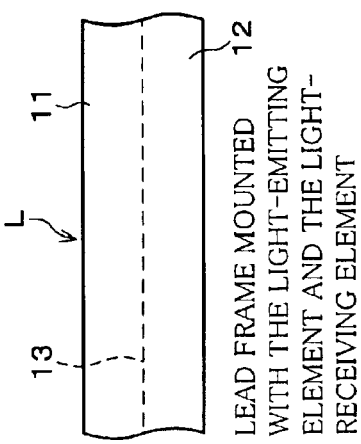

FOLDING THE LEAD FRAME SO THAT THE LIGHT-RECEIVING ELEMENT AND THE LIGHT-EMITTING ELEMENT FACE EACH OTHER

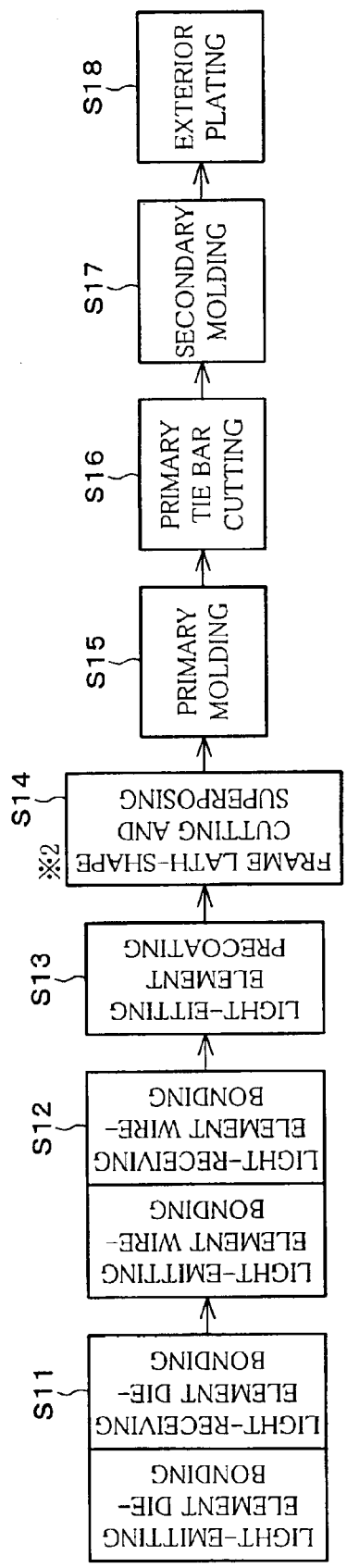
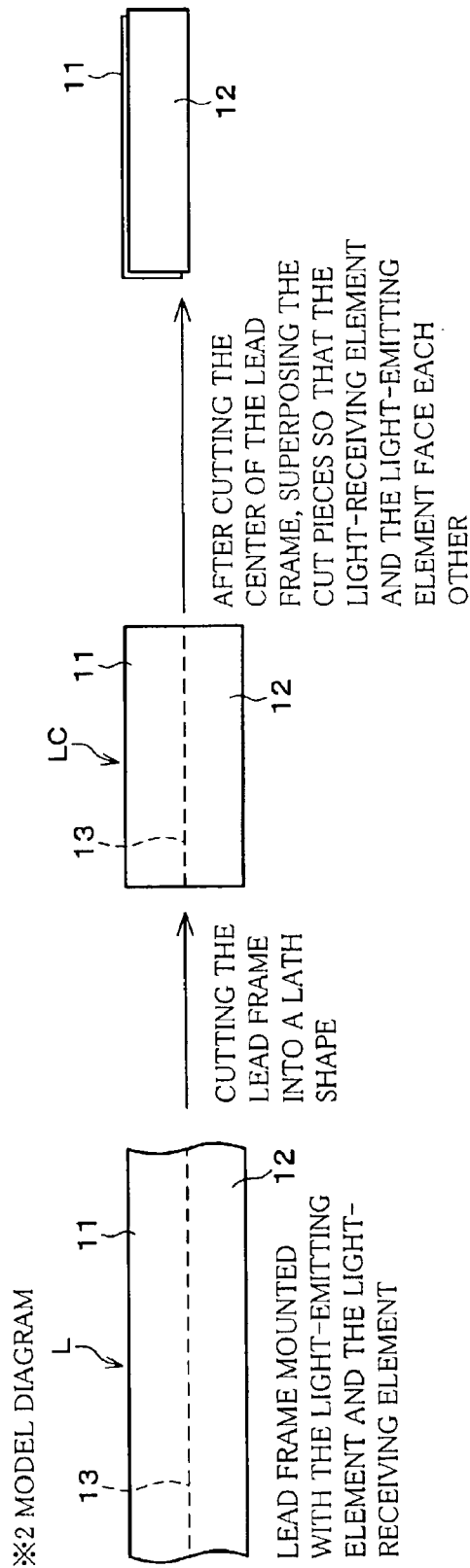
FIG. 13 (a)
FIG. 13 (b) ※2 MODEL DIAGRAM

METHOD OF MAKING AN OPTICAL COUPLING DEVICE

This nonprovisional application claims priority under 35 U.S.C. § 119(a) on Patent Application No. 2001-328040 filed in JAPAN on Oct. 25, 2001, which is herein incorporated by reference.

FIELD OF THE INVENTION

The present invention relates to a lead frame of an optical coupling device and also relates to a manufacturing method of the optical coupling device using the lead frame.

BACKGROUND OF THE INVENTION

A conventional optical coupling device (for example, a photocoupler) has an internal structure, for example, as shown in FIG. 1. The optical coupling device of FIG. 1 includes a light-emitting element 1, a light-receiving element 2, a light-emitting side lead frame 31, a light-receiving side lead frame 32, a metal wire 4, silicon resin 5, translucent epoxy resin 6, and light-shielding epoxy resin 7.

Further, examples of the lead frame used in the foregoing optical coupling device are shown in FIGS. 2(a), 2(b), 3(a), and 3(b). In the lead frame shown in FIGS. 2(a) and 2(b), header sections 31a for mounting thereon the light-emitting elements 1 and header sections 32a for mounting thereon the light-receiving elements 2 are respectively provided on separate lead frames 31 and 32 in longitudinal directions.

Further, in the lead frame shown in FIGS. 3(a) and 3(b), the header sections 31a are arranged in a matrix between cradle sections 26 of the lead frame 31. Similarly, the header sections 32a are arranged in a matrix between cradle sections 27 of the lead frame 32.

In the following, a manufacturing method of the lead frames 31 and 32 will be explained (briefly). First, the header sections 31a and 32a, which are to be mounted with the elements, are molded on a coiled metal material (a Cu material, a Fe material, etc.) using a punching mold, as shown in FIGS. 2(a) and 2(b), or FIGS. 3(a) and 3(b).

Then, the header sections 31a and 32a and second wire-bonding sections 31b and 32b (see FIGS. 2(a) and 2(b)) are subjected to silver plating, and then the header sections 31a and 32a are bent (see a flowchart of FIG. 4 which shows a manufacturing process of the lead frame. The lead frame is generally manufactured in the process as described above, but the lead frame may be manufactured in a sequential process of the "silver plating", the "punching", and the "bending", or in a sequential process of the "punching", the "bending", and the "plating".

In the optical coupling device, two kinds of the lead frames, which are the lead frame 31 mounted with the light-emitting elements 1 and the lead frame 32 mounted with the light-receiving elements 2, are required as described above, and thus two kinds of punching molds are therefore required. The optical coupling device is manufactured as described below, using the lead frames 31 and 32 shown in FIGS. 2(a) and 2(b), for example.

First, the die-bonding process is carried out for die-bonding (bonding) light-emitting element 1 and the light-receiving element 2 to header sections 31a and 32a of the lead frames 31 and 32 respectively. Then, the wire-bonding is carried out (connecting the light-emitting elements 1 and the light-receiving elements 2 to an external lead using the metal wires 4). Then, the light-emitting elements 1 are coated with the silicon resin 5 for relaxing stress.

Subsequently, the lead frames 31 and 32 are arranged so as to face each other in such a manner that respective optical axes of the light-emitting elements 1 and the light-receiving elements 2 coincide. Then, both lead frames 31 and 32 are bonded to each other by welding. Then, a primary molding is carried out using the translucent epoxy resin 6, and then the transfer molding is carried out on the entire device using the light-shielding epoxy resin 7.

A product is completed after going through respective steps of an exterior plating, a lead forming (external lead processing), an insulation withstand voltage test (insulation test between the primary molding and the secondary molding), an electric property test (measurement of electric properties), a marking, a visual inspection, and a packaging. Note that, other than the transfer molding, an injection molding or a cast molding may be adopted as a molding method. Further, in the primary molding, in replace of the transparent epoxy resin, transparent silicon resin 9 may be adopted to form a path between the light-emitting element 1 and the light-receiving element 2, as shown in FIG. 5.

A manufacturing method of the optical coupling device using the lead frames 31 and 32 shown in FIGS. 3(a) and 3(b) is the same as that using the lead frames 31 and 32 shown in FIGS. 2(a) and 2(b). Conventional examples in accordance with the lead frames 31 and 32 shown in FIGS. 3(a) and 3(b) are disclosed in Japanese Unexamined Patent Publication Nos. 6-237010/1994 (Tokukaihei 6-237010, published on Aug. 23, 1994) and 7-254728/1995 (Tokukaihei 7-254728, published on Oct. 3, 1995), for example. Further, a flowchart showing the manufacturing process and a line block diagram of the conventional optical coupling device are shown in FIGS. 6 and 7.

Incidentally, in recent years, in accordance with intensified price competition in electronic parts, it becomes a critical issue to reduce a fixed cost such as equipment amortization cost as well as variable cost such as material cost. This further makes it critical to increase efficiency in material (to reduce a material cost per electronic part), and to reduce an equipment cost by streamlining an equipment arrangement.

When the conventional lead frame is used, the lead frame for mounting thereon the light-emitting elements and the lead frame for mounting thereon the light-receiving elements are respectively required. Thus, as shown in the flowchart of FIG. 6, which shows a manufacturing method, and the line block diagram of FIG. 7, for example, two separate processing and conveyance systems C1 and C2 are required for respectively performing the die-bonding and the wire-bonding for the respective lead frames.

Namely, it is required to separately arrange (a) the processing and conveyance system C1 on the light-emitting element side, from steps such as the die-bonding, the wire-bonding, and the pre-coating, to a step of superposing and welding the both lead frames with each other, and (b) the processing and conveyance system C2 on the light-receiving element side, from respective steps such as the die-bonding, the wire-bonding, and the pre-coating, to a step of superposing and welding the both lead frames with each other.

Therefore, a large space is required for installing the manufacturing device, and equipment expenses are increased. Further, since two lead frames are required for the light-emitting element side and the light-receiving element side respectively, two molds are required for manufacturing (punching) the lead frames, which, in turn, increases a manufacturing cost, resulting in high costs of the optical coupling device.

SUMMARY OF THE INVENTION

In view of the foregoing problems, an object of the present invention is to provide a lead frame of an optical coupling device with a small number of components, which can be manufactured with ease at low cost, and to provide a manufacturing method of the optical coupling device.

A lead frame of an optical coupling device of the present invention is characterized by including (1) a light-emitting side section in which a plurality of header sections for mounting thereon light-emitting elements are aligned, (2) a light-receiving side section in which a plurality of header sections for mounting thereon light-receiving elements are aligned, and (3) a connecting section for connecting the light-emitting side section and the light-receiving side section in parallel into one body.

With this structure, after mounting the elements to the header sections of the lead frame, the lead frame is folded at the connecting section so that the light-emitting elements and the light-receiving elements face each other, and the lead frame is then subjected to molding, thereby manufacturing an optical coupling device.

According to the foregoing structure, the lead frame is formed into one body by means of the connecting section, the required number of components can be reduced, and the lead frame can be formed (manufactured) by means of a single mold. Further, the lead frame requires only one processing and conveyance system, thereby allowing conveyance control to be performed in a simplified manner.

Therefore, it is possible to significantly downsize a manufacturing device and a conveyance device (of the optical coupling device) including the mold (of the lead frame) as compared to the conventional arrangement, and remarkably reduce a running cost of the manufacturing and conveyance devices, thereby significantly reducing manufacturing cost of the optical coupling device. Further, it is possible to maintain the equipment device in a simplified manner.

Incidentally, in the optical coupling device, when the lead frame is formed into a hoop shape (reel shape), it is possible to consecutively place (feed) them into a line, whereas when the lead frame is formed into a lath shape, it is possible to consecutively place a large number of piles of the lath-shaped lead frames sequentially in an efficient manner, for example. This significantly improves the work efficiency in each of the manufacturing steps, and downsizes each of the processing equipments.

A manufacturing method of an optical coupling device of the present invention, using a lead frame, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section for connecting the light-emitting side section and the light-receiving side section in parallel into one body, the method of the optical coupling device is characterized by including the steps of (a) mounting the light-emitting elements and the light-receiving elements on the lead frame so as to sandwich the connecting section, and (b) folding the lead frame at the connecting section after carrying out the step (a).

In the above process, the step (b) is carried out after carrying out the step (a). According to the foregoing method, only one processing and conveyance system is required for the lead frame, and the conveyance thereof can be controlled with ease, and it is therefore possible to significantly downsize a manufacturing device including a conveyance device as compared to the conventional arrangement, and to reduce a running cost of the manufacturing and conveyance devices, thereby significantly reducing a manufacturing cost of the optical coupling device. Further, it is possible to maintain the equipment device in a simplified manner.

Note that, primary molding using translucent resin (translucent epoxy resin, for example) or secondary molding using light-shielding resin (light-shielding epoxy resin, for example) is carried out after carrying out the step (b), so as to complete the optical coupling device.

A manufacturing method of an optical coupling device, using a lead frame, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section for connecting the light-emitting side section and the light-receiving side section in parallel into one body is characterized by including the steps of (e) mounting the light-emitting elements and the light-receiving elements on the lead frame so as to sandwich the connecting section, (f) cutting the lead frame into a lath shape with a predetermined length in a direction substantially orthogonal to a longitudinal direction after carrying out the step (e), (g) cutting a center of the connecting section of the lead frame as cut into the lath shape in the step (f), and (h) superposing the light-emitting side section and the light-receiving side section, as cut in the step (g).

By cutting the lead frame into a lath shape with a predetermined length in the step (f), in particular, it becomes easy to handle the lead frame in each of the subsequent steps, thereby improving the work efficiency. Further, since the lead frame requires only one processing and conveyance system throughout the manufacturing processes, and the conveyance can be controlled with ease, it is possible to significantly downsize a manufacturing device including a conveyance device as compared to the conventional arrangement, and to reduce the running cost of the manufacturing and conveyance devices, thereby significantly reducing manufacturing cost of the optical coupling device. Further, it is possible to maintain the equipment device in a simplified manner.

Note that, the primary molding using translucent resin (translucent epoxy resin, for example) or the secondary molding using light-shielding resin (light-shielding epoxy resin, for example) is carried out after carrying out the step (h), to complete the manufacturing process of the optical coupling device.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) shows a lead frame mounted with a light-emitting element, whereas FIG. 2(b) shows a lead frame mounted with a light-receiving element.

FIG. 3(a) shows a lead frame mounted with the light-emitting element, whereas FIG. 3(b) shows a lead frame mounted with the light-receiving element.

FIGS. 12(a) and 12(b) are diagrams showing a manufacturing process of an optical coupling device in accordance with a sixth embodiment of the present embodiment. FIG. 12(a) is a flowchart showing the manufacturing process, and FIG. 12(b) is an explanatory diagram showing a frame folding step.

FIGS. 13(a) and 13(b) are diagrams showing a manufacturing process of an optical coupling device in accordance with a seventh embodiment of the present embodiment. FIG. 13(a) is a flowchart showing the manufacturing process, and FIG. 13(b) is an explanatory diagram showing frame lath-shape cutting and superposing.

DESCRIPTION OF THE EMBODIMENTS

The following will explain a lead frame of an optical coupling device, and a manufacturing method of the optical coupling device in accordance with one embodiment of the present invention.

The lead frame of the optical coupling device has a basic structure wherein (a) a light-emitting side section in which a plurality of header sections for mounting thereon light-emitting elements are aligned and (b) a light-receiving side section in which a plurality of header sections for mounting thereon light-receiving elements are aligned are connected in parallel into one body via a connecting section.

With this arrangement, it is possible to manufacture the lead frame using a single mold and a single processing and conveyance system of the lead frame. This significantly streamlines manufacturing equipments as compared to the conventional arrangement, thereby significantly reducing a manufacturing cost of the lead frame and of the optical coupling device. Note that, in drawings of respective embodiments as described below, the same or equivalent members will be given the same reference symbols. Further, an arrangement of the optical coupling device in the respective embodiments is referred to FIG. 1.

[First Embodiment]

Figure 8:
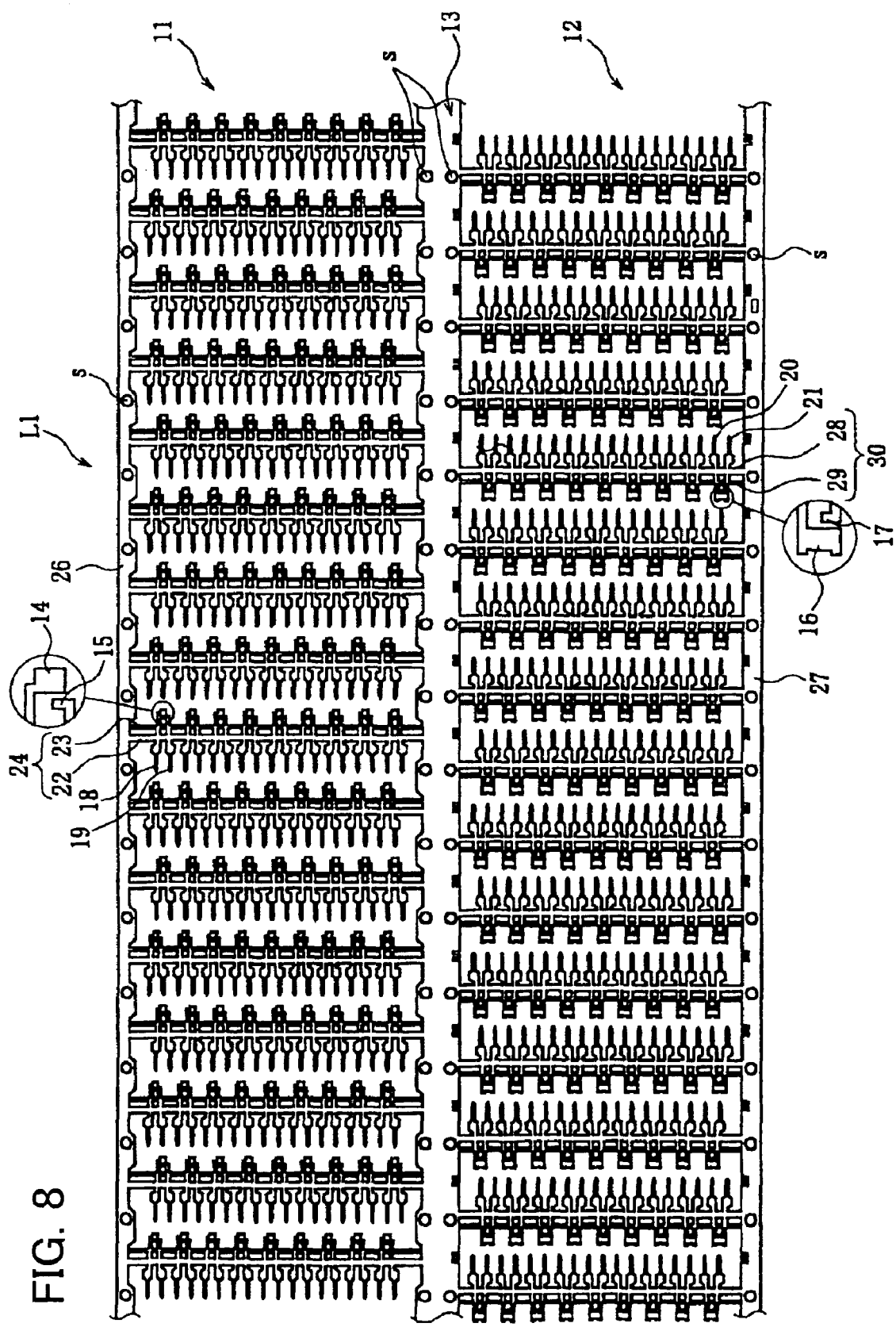
FIG. 8 is a plan view of a lead frame of an optical coupling device in accordance with a first embodiment of the present invention.

A lead frame L1 in the present embodiment is shown in FIG. 8. As illustrated in FIG. 8, the lead frame L1 includes: a light-emitting side section 11, a light-receiving side section 12, and a connecting section 13 for connecting the light-emitting side section 11 and the light-receiving side section 12 into one body. In the light-emitting side section 11, a plurality of header sections 14 for mounting thereon light-emitting elements (1) and second wire-bonding sections 15 are aligned in a matrix. In the light-receiving side section 12, a plurality of header sections 16 for mounting thereon light-receiving elements (2) and second wire-bonding sections 17 are aligned in a matrix. Note that, a reference numeral in parentheses indicates a corresponding reference numeral of a member shown in FIG. 1 (hereinafter the same is applied).

More specifically, in the light-emitting side section 11, the header sections 14 and leads 18, and the second wire-bonding sections 15 and leads 19 are arranged and formed at predetermined intervals on a tie bar 24. The tie bar 24 is composed of two tie bar lines 22 and 23 which are bridged between the connecting section 13 and a cradle section 26.

Further, in the light-receiving side section 12, the header sections 16 and leads 20, and the second wire-bonding sections 17 and leads 21 are arranged and formed at predetermined intervals on a tie bar 30. The tie bar 30 is composed of two tie bar lines 28 and 29 which are bridged between the connecting section 13 and a cradle section 27.

Figure 1:
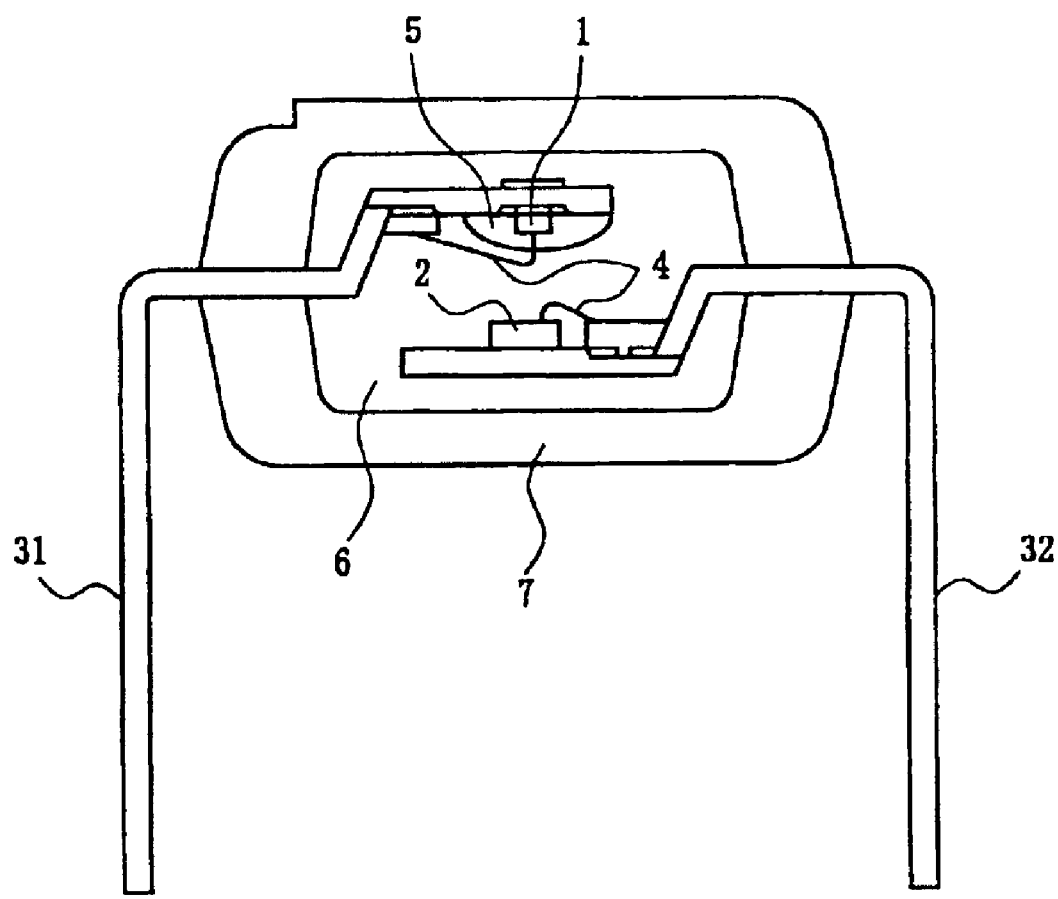
FIG. 1 is an explanatory diagram showing an internal structure of a conventional optical coupling device.
Figure 2:
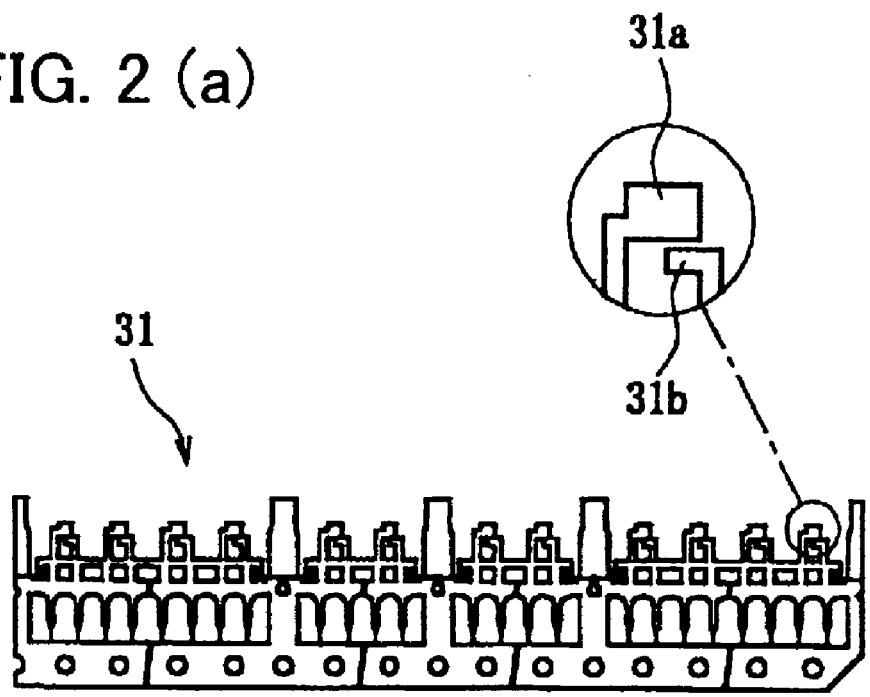
FIGS. 2(a) and 2(b) are plan views showing a lead frame of a conventional optical coupling device.
Figure 2:
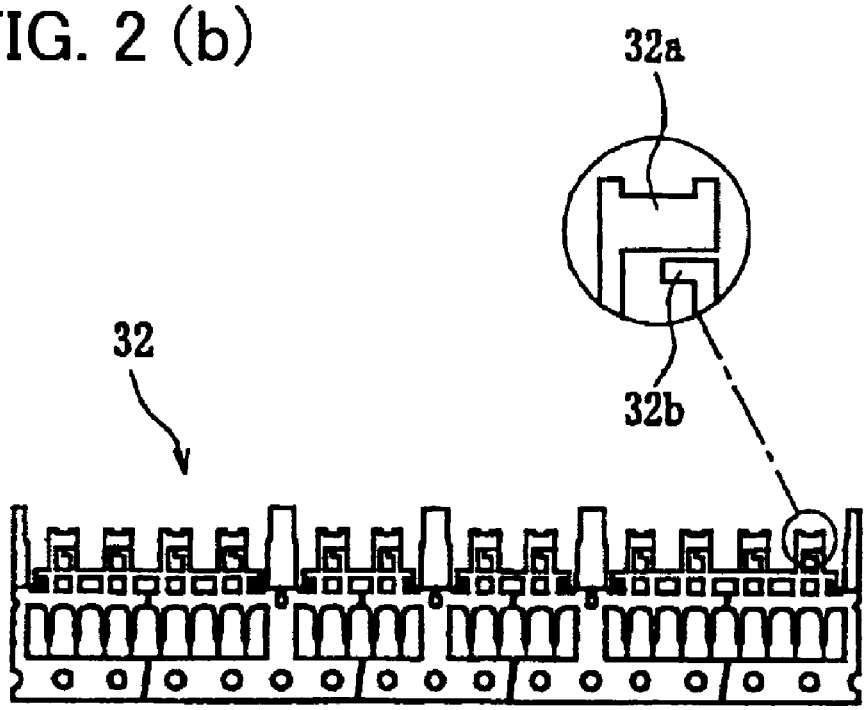
Figure 3:
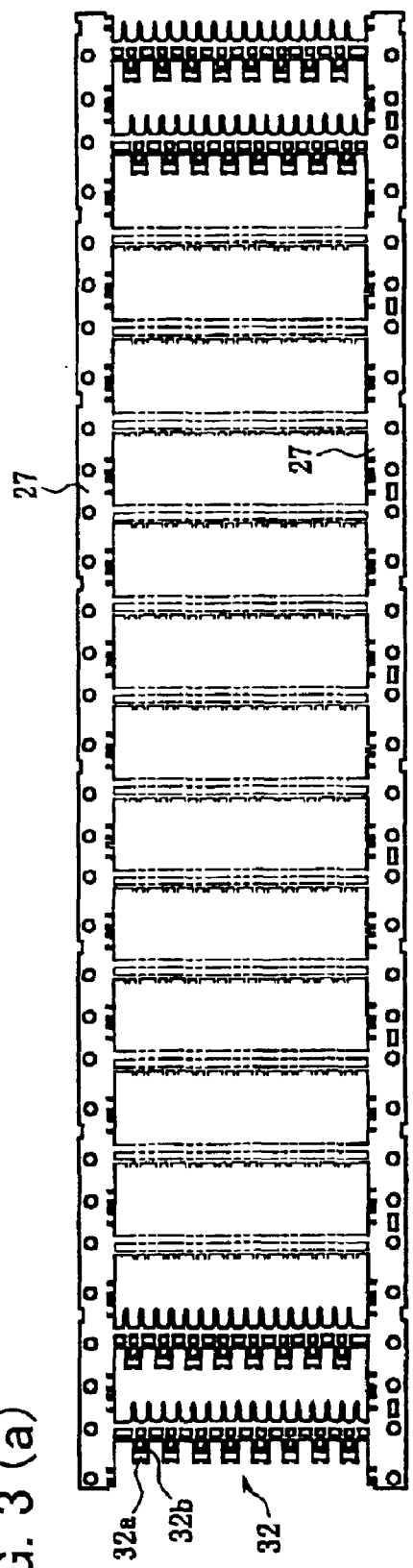
FIGS. 3(a) and 3(b) are plan views showing another example of a lead frame of the conventional optical coupling device.
Figure 3:
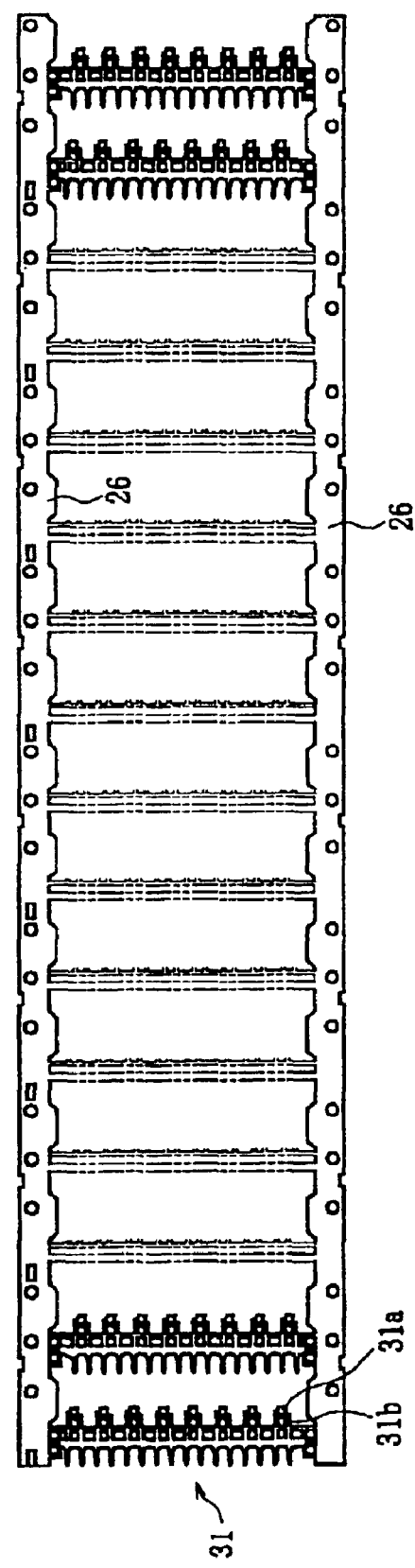
Figure 4:
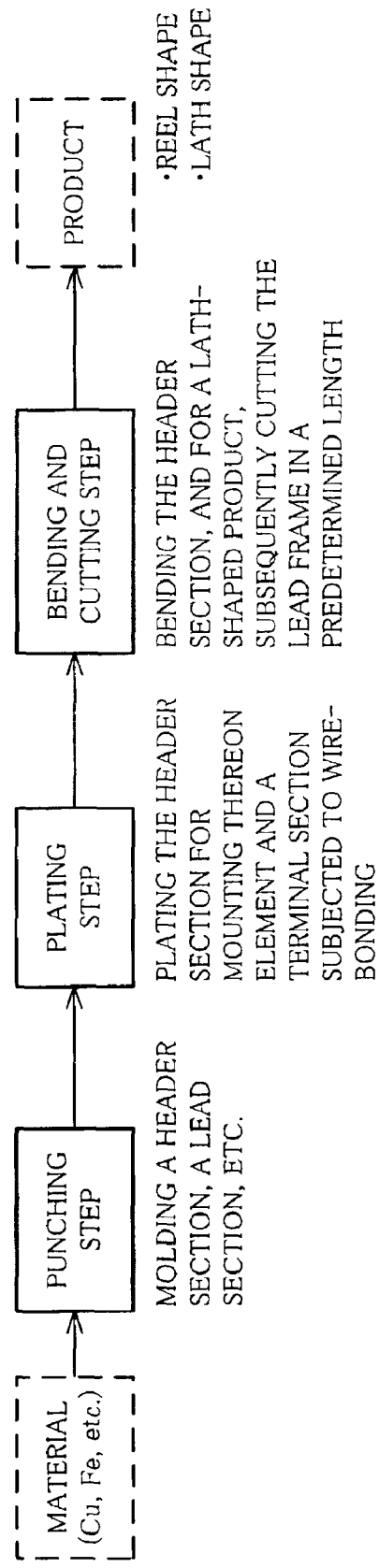
FIG. 4 is an explanatory diagram showing a manufacturing process of the lead frame of the conventional optical coupling device.
Figure 5:
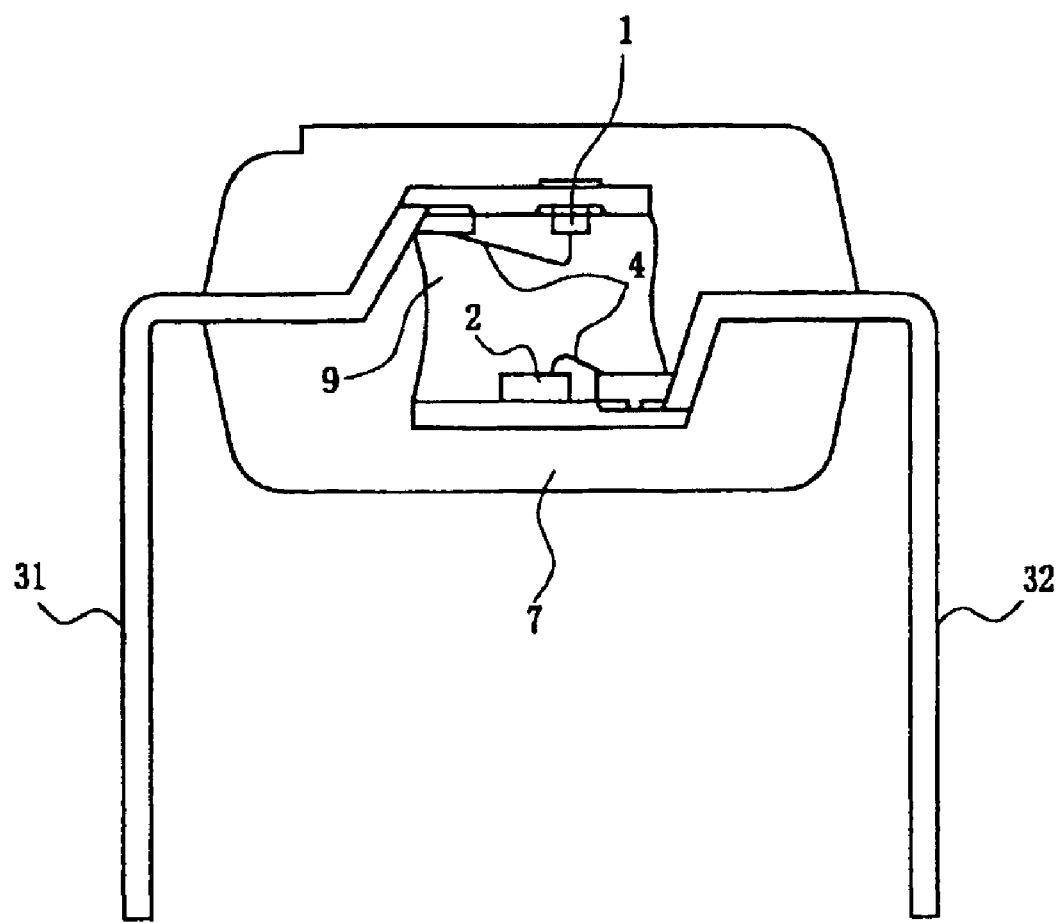
FIG. 5 is an explanatory diagram showing an internal structure of an optical coupling device which is different from the optical coupling device in FIG. 1.

Further, the connecting section 13 and the both cradle sections 26 and 27 are formed with conveyance sprocket holes s at predetermined intervals. Note that, the leads 18 and 19, as well as the leads 20 and 21 respectively correspond to reference numerals 31 and 32 in FIG. 1 (FIG. 1 is a conventional diagram).

Figure 6:
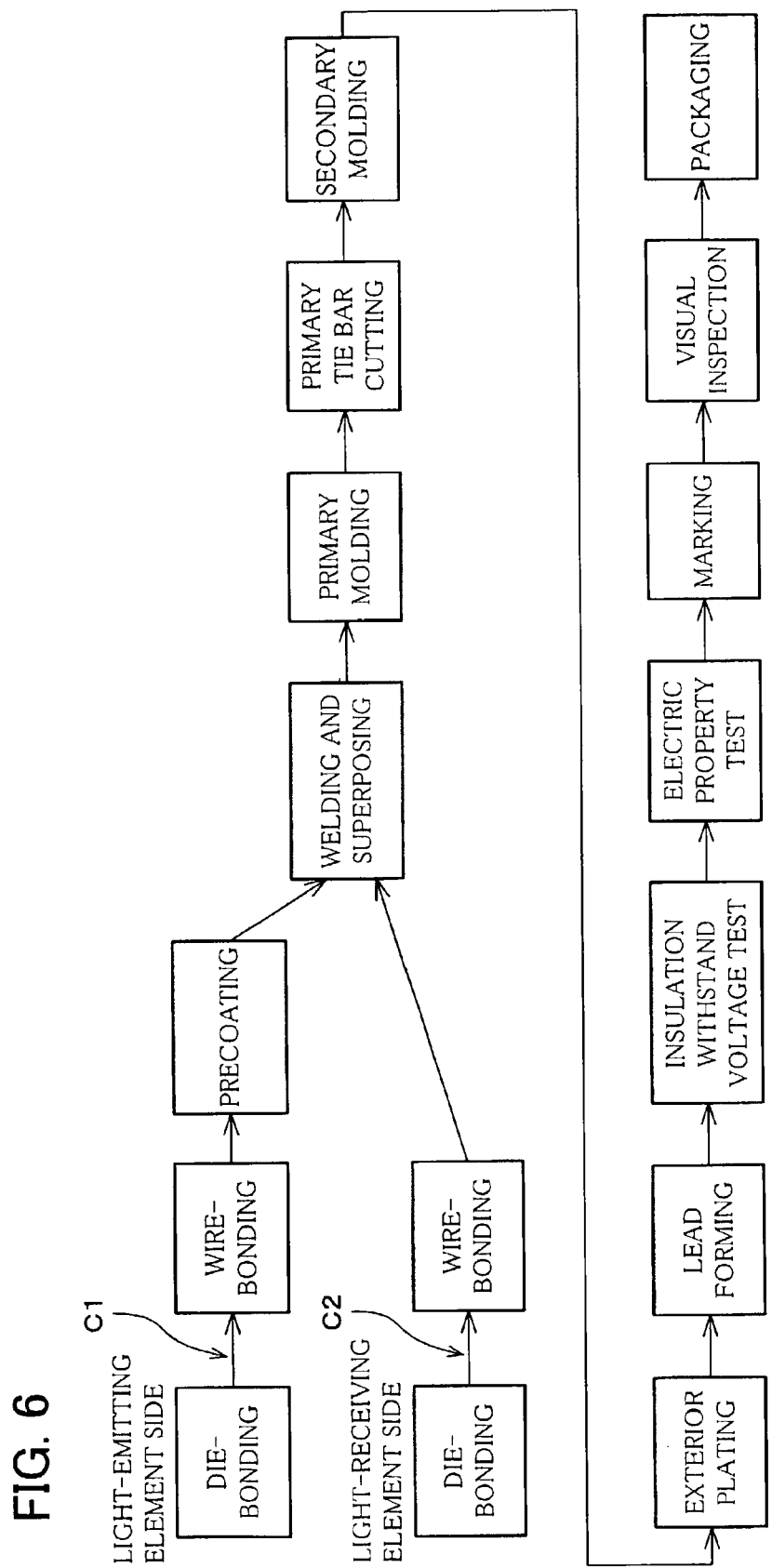
FIG. 6 shows an explanatory diagram showing a manufacturing process of the conventional optical coupling device.
Figure 7:
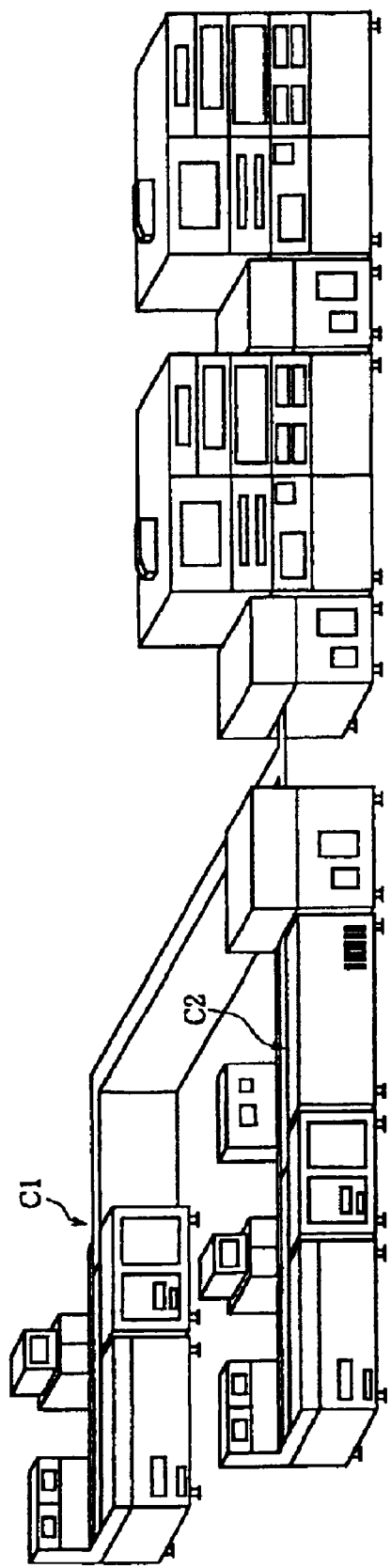
FIG. 7 shows a line block diagram showing the manufacturing process of the conventional optical coupling device.
Figure 14:
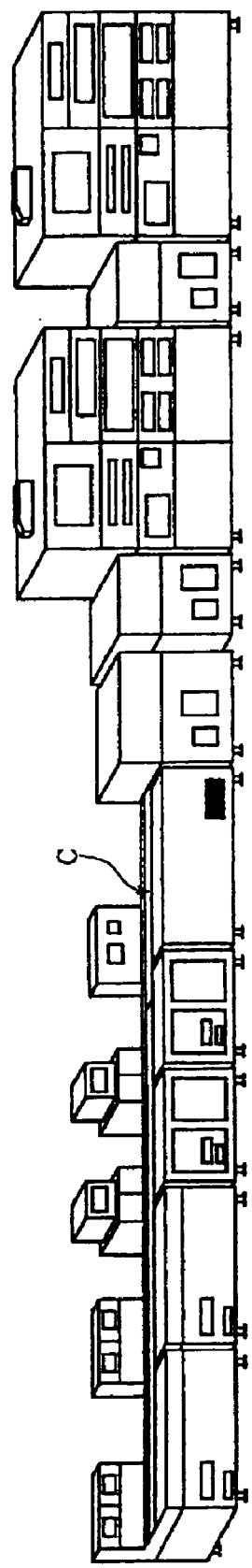
FIG. 14 is a line flowchart showing the manufacturing process of the optical coupling device in each of the embodiments of the present invention.

As described above, the light-emitting side section 11 and the light-receiving side section 12 are connected in parallel into one body via the connecting section 13, the lead frame L1 can be punched by means of the single mold, thereby significantly reducing a manufacturing cost. Further, as shown in the manufacturing line block diagram of FIG. 14, it is possible to convey the lead frame L1 using a single processing and conveyance system C in the manufacturing process (the conventional processing and conveyance system is separated into two systems as shown in FIGS. 6 and 7). This significantly reduces an area for installing the conveyance and manufacturing equipment as compared to the conventional arrangement, and significantly reduces a running cost as well as a cost required for the equipments.

[Second Embodiment]

Figure 9:
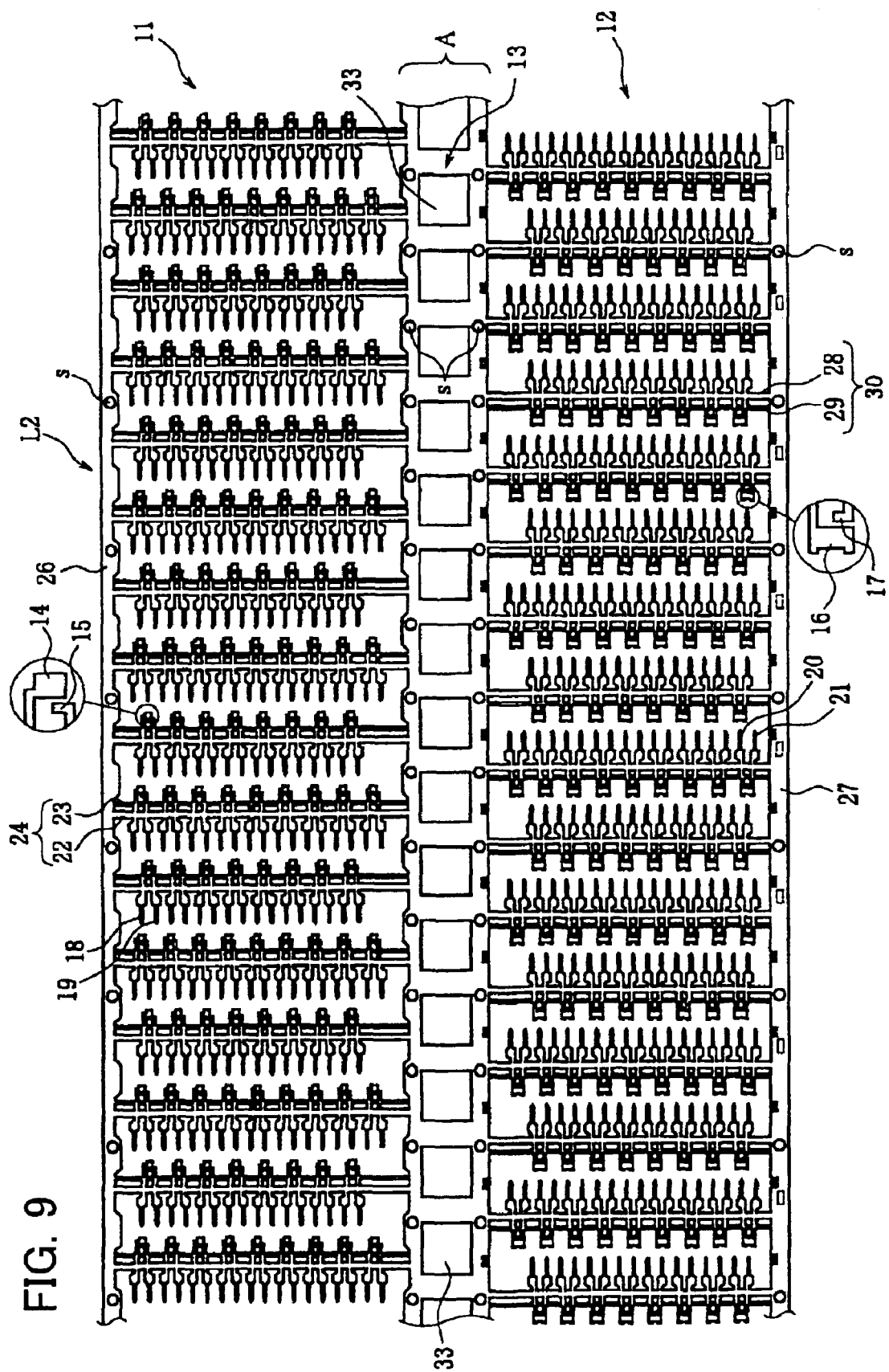
FIG. 9 is a plan view of a lead frame of an optical coupling device in accordance with second and third embodiments of the present invention.

A lead frame L2 of the present embodiment is shown in FIG. 9. In the lead frame L2, element supply holes 33 for picking up the element are formed in the connecting section 13 of the first embodiment. Chips (the light-emitting element and the light-receiving element), which have been subjected to dicing (cutting up), are picked up through the element supply holes 33, so as to be mounted to the header sections 14 and 16 of the lead frame L2 with high work efficiency.

Each of the element supply holes 33 is provided in the middle position of each header column of the light-emitting side section 11 and each corresponding header column of the light-receiving side section 12. Thus, the chip can be attached on each header section 14 of the light-emitting side section 11 and on each header section 16 on the light-receiving side section 12 through each corresponding element supply hole 33 with high work efficiency. The element supply hole 33 as described above can be formed with ease when the lead frame L2 is punched out.

[Third Embodiment]

The connecting section 13 in FIG. 9 is formed so as to have a sufficient width to ensure a margin (a folding margin) for folding the lead frame L2 along the center so as to superpose the light-emitting side section 11 and the light-receiving side section 12. By setting a folding margin A as described above, the folding step for superposing the both sections 11 and 12 can be performed with ease when superposing the lead frame L2 so that the light-emitting elements (1) and the light-receiving elements (2) face each other in the manufacturing process of the optical coupling device.

[Fourth Embodiment]

Figure 10:
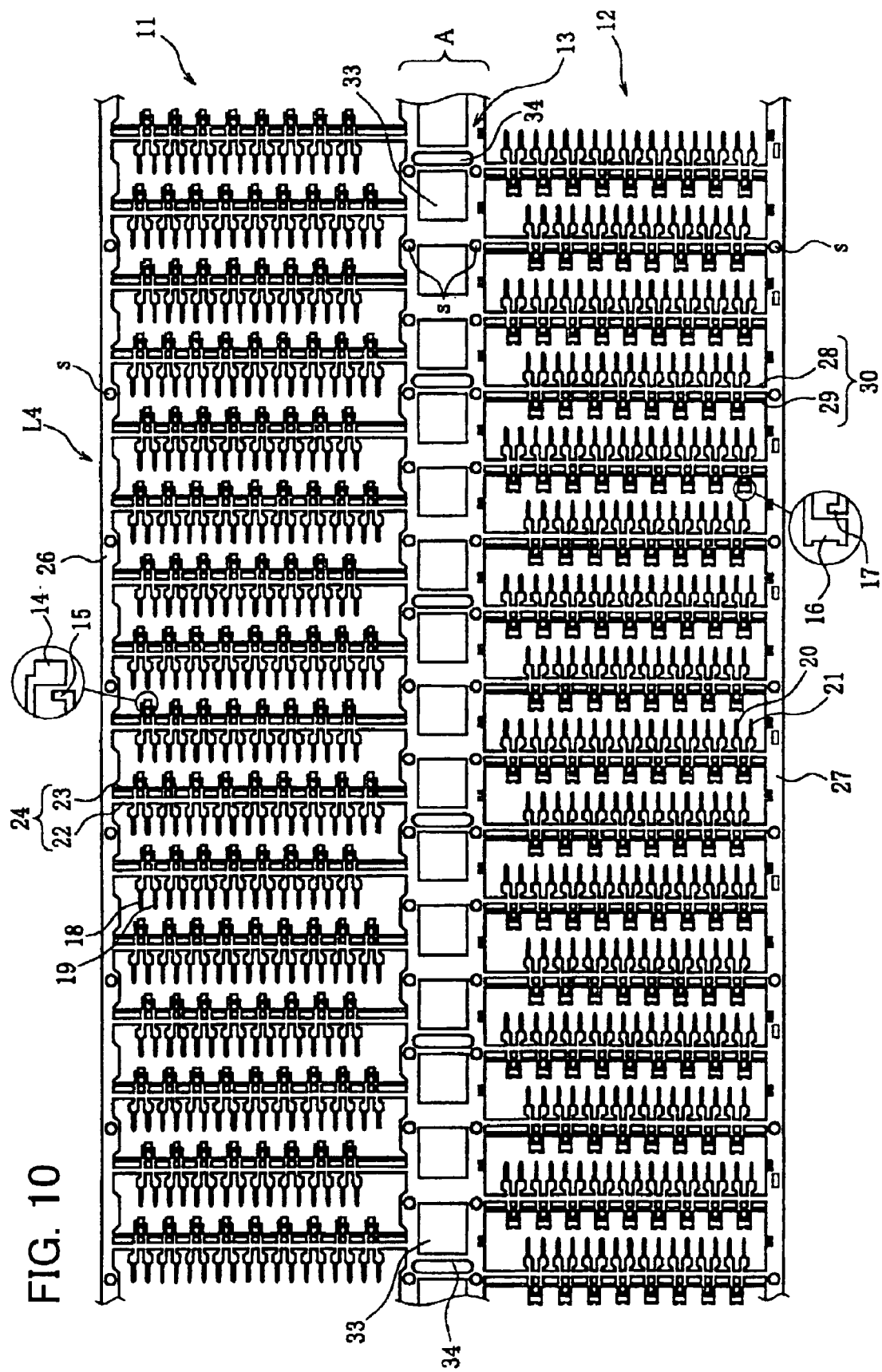
FIG. 10 is a plan view of a lead frame of an optical coupling device in accordance with a fourth embodiment of the present invention.

A lead frame L4 in accordance with the present embodiment will be explained in reference to FIG. 10. In this case, the connecting section 13 with a folding margin A shown in FIG. 9 is provided with the opening of long holes 34, or concave sections, etc. as the folding section for facilitating the folding. This allows the lead frame L4 to be folded with ease at the center. The opening of the long holes 34, or the concave sections, etc., can be formed with ease when the lead frame L4 is punched out by means of the mold.

[Fifth Embodiment]

Figure 11:
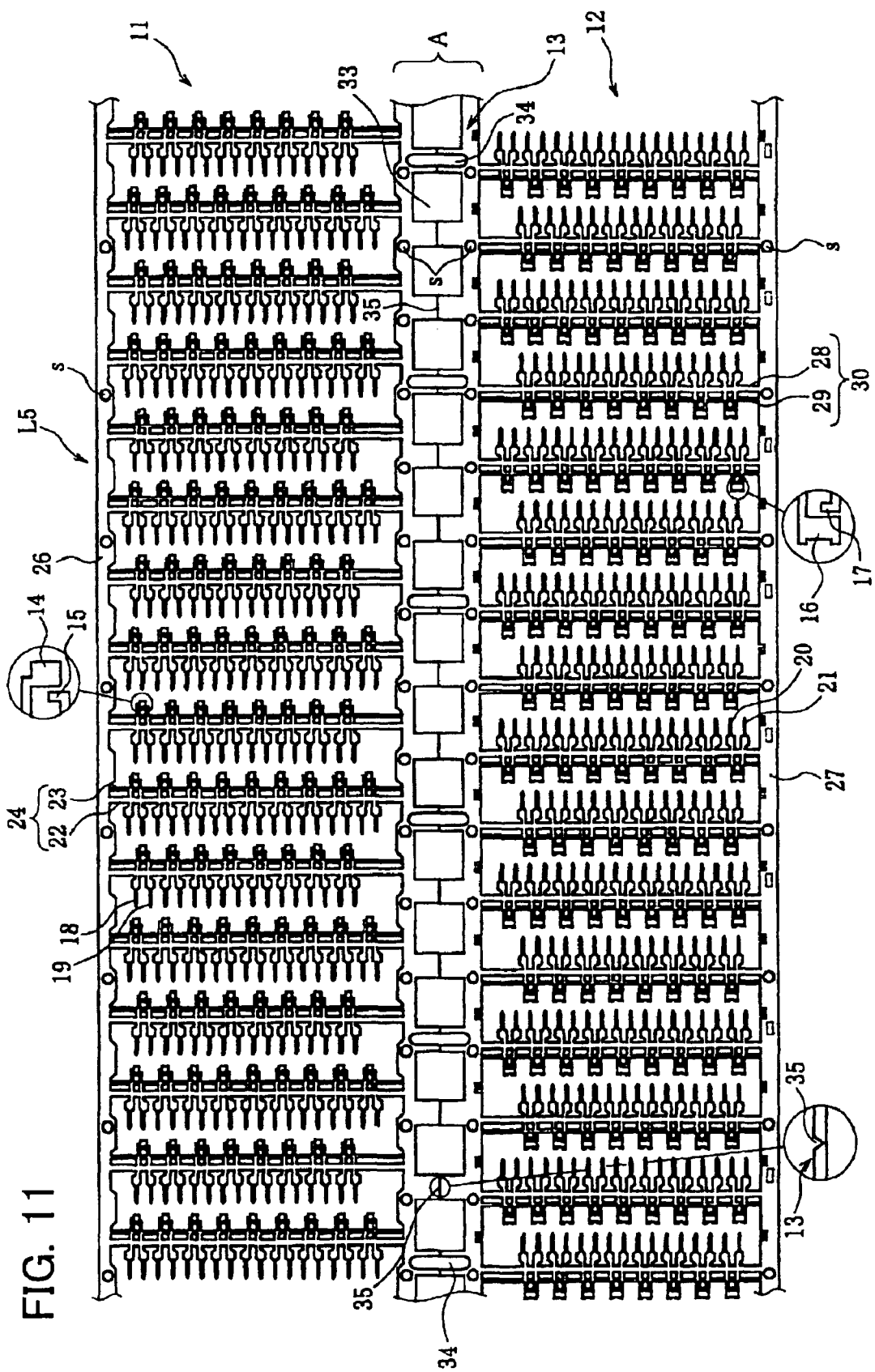
FIG. 11 is a plan view of a lead frame of an optical coupling device in accordance with a fifth embodiment of the present invention.

A lead frame L5 in accordance with the present embodiment will be explained in reference to FIG. 11. In the present embodiment, at the center of the connecting section 13 with the folding margin A, a V groove 35 (or a concave groove) is formed as a folding section for facilitating the folding of the lead frame L5. This allows the lead frame L5 to be surely folded at the center with ease. This V groove 35 (or the concave groove), etc., can be formed with ease when the lead frame L5 is punched out by means of the mold.

[Sixth Embodiment]

A manufacturing method of the optical coupling device in accordance with the present embodiment will be explained in reference to the flowchart of FIG. 12(a) which explains the manufacturing process. Namely, a single lead frame L is adopted wherein (a) the light-emitting side section 11 in which the plurality of header sections 14 for mounting thereon the light-emitting elements (1) are aligned, and (b) the light-receiving side section 12 in which the plurality of header sections 16 for mounting thereon the light-receiving elements (2) are aligned, are connected in parallel into one body via the connecting section 13, as shown in FIGS. 8 through 11. Then, as shown in FIG. 12(b), the lead frame L is folded at the connecting section 13 so as to superpose the light-emitting side section 11 and the light-receiving side section 12 in the frame folding step (S4), thus requiring only the single processing and conveyance system C during overall processing steps (S1 through S8).

Note that, each of the processing steps (S1 through S8) shown in the flowchart of FIG. 12(a) showing the manufacturing process is a technique used in the manufacturing method of the conventional optical coupling device, wherein the light-emitting elements (1) and the light-receiving elements (2), which face each other, are molded with translucent epoxy resin (6) in a primary molding step, and the entire device is subjected to the transfer molding using light-shielding epoxy resin (7) in the secondary molding step (see FIG. 1).

[Seventh Embodiment]

A manufacturing method of the optical coupling device in accordance with the present embodiment will be explained in reference to the flowchart of FIG. 13(a). In the present embodiment, a single lead frame L, for example, is so arranged that (a) the light-emitting side section 11 in which the plurality of header sections 14 for mounting thereon the light-emitting element (1) are aligned and (b) the light-receiving side section 12 in which the plurality of header sections 16 for mounting thereon the light-receiving element (2) are aligned are connected in parallel into one body via the connecting section 13, as shown in FIGS. 8 through 11. The header sections 14 and 16 of the lead frame L are respectively mounted with the light-emitting elements (1) and the light-receiving elements (2), and then the lead frame L is cut into a lath shape with a predetermined length. Further, the light-emitting side section 11 and the light-receiving side section 12 are separated by cutting the center of the connecting section 13. The both sections 11 and 12 are then superposed and then subjected to the transfer molding.

During S11 through S13, the lead frame L is maintained in a form of a long sheet. Then, after completing the pre-coating step of the light-emitting element (S13), "a frame lath-shape cutting and superposing step (S14)" is carried out as shown in FIG. 13(b). In this step, the lead frame L is cut into the lath shape with a predetermined length, the light-emitting side section 11 and the light-receiving side section 12 are separated by cutting off a lath-shaped lead frame LC at the center (the connecting section 13), and the both sections 11 and 12 are superposed so that the light-emitting elements (1) and the light-receiving elements (2) face each other. Then, the sequence proceeds to the steps in and after the first molding step (S15). The overall processing steps (S11 through S18) including the frame lath-shape cutting and superposing step (S14) also require only the single processing and conveyance system C, as in the method of the sixth embodiment (see the line block diagram of FIG. 14).

[Eighth Embodiment]

A manufacturing method of the optical coupling device in accordance with the present embodiment will be explained. In the die-bonding step in the manufacturing method of the sixth or seventh embodiment (S1 in FIG. 12 or S11 in FIG. 13), elements are picked up through the element supply holes 33 (see FIG. 9) formed at the connecting section 13 of the lead frame L2 of the second embodiment. More specifically, in the die-bonding step, chips (elements) attached to a dicing sheet is pushed up through the element supply holes 33 from bottom using a pin, and the chips as pushed up are subjected to vacuum chucking from above using a pickup collet, so as to be placed on and bonded to each of the header sections 14 and 16, for example. The element supply hole 33 is formed at the middle position of the corresponding header sections 14 and 16, and thus the die-bonding step is efficiently carried out.

[Ninth Embodiment]

A manufacturing method of the optical coupling device in accordance with the present embodiment will be explained. In the present embodiment, the die-bonding step in the manufacturing method of the sixth or seventh embodiment (S1 in FIG. 12 or S11 in FIG. 13), is carried out from the outside of the lead frame L when using the lead frame L (for example, L1 in FIG. 8, etc.) in which the element supply holes 33 are not formed at the connecting section 13. More specifically, in the die-bonding step, the chips (elements) attached to the dicing sheet are subjected to vacuum chucking using the pickup collet, and the chips are placed on and bonded to each of the header sections 14 and 16 from the outside of the lead frame L. In this case, the element supply holes 33 are not formed in the connecting section 13, thereby simplifying the structure of the lead frame L.

[Tenth Embodiment]

Figure 15:
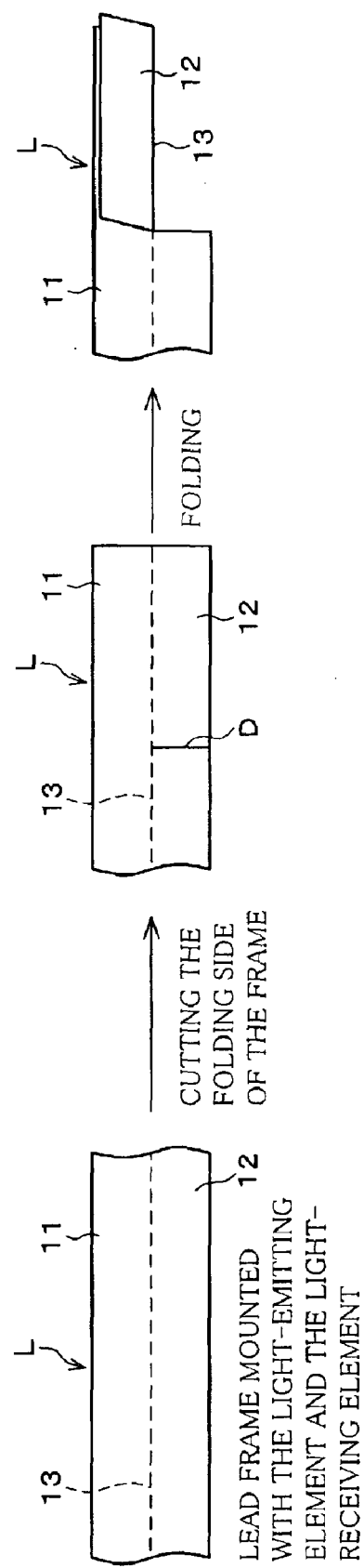
FIG. 15 is an explanatory diagram of a main manufacturing process of a lead frame of an optical coupling device in accordance with a tenth embodiment of the present invention.

A manufacturing method of the optical coupling device in accordance with the present embodiment will be explained in reference to FIG. 15. In the present embodiment, the lead frame L of the sixth embodiment is adopted, and either the light-emitting side section 11 or the light-receiving side section 12 to be folded is cut at least to a folding line (see a cutting line D in a direction substantially orthogonal to a longitudinal direction), and the lead frame is then folded at the center. According to the method of the present embodiment, it is possible to apply the subsequent steps only to the portion as desired of the lead frame without waste.

[Eleventh Embodiment]

A manufacturing method of the optical coupling device in accordance with the present embodiment will be explained. In the present embodiment, when folding the lead frame at the center, the lead frame L in the sixth embodiment (see FIG. 12) is cut out into a unit with a length as desired to be folded in a width direction (not necessarily be in the lath shape), in consideration of various conditions such as specification and productivity of the optical coupling device to be manufactured.

[Twelfth Embodiment]

A manufacturing method of the optical coupling device in accordance with the present embodiment will be explained. In the present embodiment, the section to be folded (the light-receiving side section 12, for example) of the lead frame is cut at least to a folding line along the cutting line D in a direction substantially orthogonal to a longitudinal direction, as in the tenth embodiment (see FIG. 15). Then, the connecting section 13 (on one side) of the light-receiving side section 12 is formed to be symmetrical with the connecting section (on the other side) 13 of the light-emitting side section 11.

By arranging the respective sides of the connecting section 13 to be symmetrical, the respective positions of the conveyance sprocket holes s, formed on both sides of the connecting section 13, can be matched in the folded state, thus ensuring the conveyance of the lead frame L as folded using the sprocket holes s.

[Thirteenth Embodiment]

A manufacturing method of the optical coupling device in accordance with the present embodiment will be explained. The manufacturing method of the present embodiment is arranged in view of the problem associated with the manufacturing method of the sixth embodiment. Namely, when the lead frame is folded at the center (the frame folding step (S4)) so that the light-emitting side section 11 and the light-receiving side section 12 face one another in the sixth embodiment, a reaction force is exerted by a metal spring, which hinders the light-emitting side section 11 and the light-receiving side section 12 from being placed so as to face one another in the normal position. In response, the manufacturing method of the optical coupling device in accordance with the present embodiment is arranged such that an outside edge of the folding section (the cradle section 27 of the light-receiving side section 12, for example) and an outside edge of the other side section (the cradle section 26 of the light-emitting section 11, for example) are fixed by welding, bonding, etc., after the lead frame is folded at the center.

As described above, by forming the light-emitting side section 11 and the light-receiving side section 12 into one body in a fixed state, the light-emitting elements (1) and the light-receiving elements (2) can be held in a fixed state in which the light-emitting elements (1) and the light-receiving elements (2) face each other in the proper positions. According to the foregoing manufacturing method, quality optical coupling devices can be obtained under stable conditions. Moreover, it is possible to superpose the light-emitting section 11 and the light-receiving section 12 in a fixed state where the respective positions of the sprocket holes s formed in the both sections 11 and 12 are matched each other. This ensures the conveyance after folding the lead frame so that the both sections 11 and 12 are superposed.

[Fourteenth Embodiment]

A manufacturing method of the optical coupling device in accordance with the present embodiment will be explained. In the present embodiment, after folding the lead frame or superposing the light-emitting side section 11 and the light-receiving side section 12 in the sixth embodiment or the seventh embodiment, the sprocket holes s are formed in the light-emitting side section 11 and the light-receiving side section 12 in such a manner that the respective positions of the sprocket holes s on the sections 11 and 12 are matched each other. This ensures the conveyance of the lead frame L after the both sections 11 and 12 are formed into one body.

[Fifteenth Embodiment]

Figure 16:
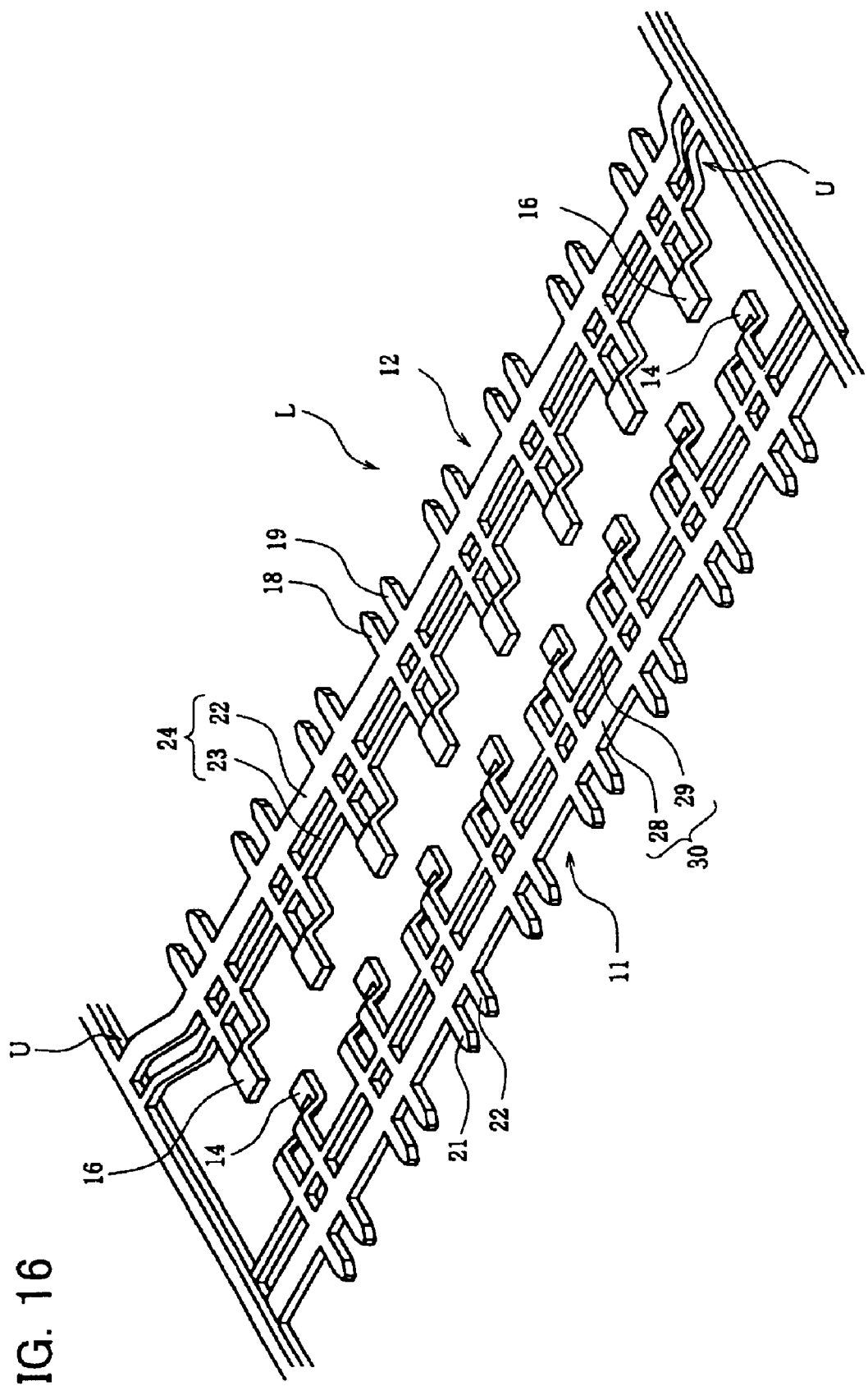
FIG. 16 is an enlarged perspective view of a lead frame of an optical coupling device in accordance with a fifteenth embodiment of the present invention.

A manufacturing method of the optical coupling device in accordance with the present embodiment will be explained. In the manufacturing method of the sixth or seventh embodiment, an upset U (upset bending) is required to be formed on either the light-emitting side section 11 or the light-receiving side section 12, as shown in FIG. 16, for example, in order to match respective positions for pulling up the leads 18, 19 (31) of the light-emitting side section 11 and the leads 20, 21 (32) of the light-receiving side section 12 from a package as a product. In the present embodiment, the upset U is formed using a mold directly before carrying out the die-bonding step or before carrying out the primary molding step. Note that, in this case, the upset U is formed on both side sections of the tie bar 24 composed of the tie bar lines 22 and 23 of the light-emitting side section 11.

[Sixteenth Embodiment]

A manufacturing method of the optical coupling device in accordance with the present embodiment will be explained. In the present embodiment, the lead frame L as manufactured by the method of the sixth or seventh embodiment is formed in a hoop shape (or a reel shape) (not shown). With this structure, it is possible to consecutively place (feed) the lead frames into a line.

[Seventeenth Embodiment]

A manufacturing method of the optical coupling device in accordance with the present embodiment will be explained. In the present embodiment, the lead frame L as manufactured by the method of the sixth or seventh embodiment is formed in a lath shape (not shown). In this case, it is possible to consecutively place (feed) a large number of piles of the lead frames into the line efficiently, thereby significantly improving the efficiency in each of the processing steps, and downsizing each of the processing equipments.

For example, a lead frame of an optical coupling device of the present invention, which is mounted with a light-emitting element and a light-receiving element, may be so arranged that (1) a light-emitting side section in which a plurality of header sections for mounting thereon the light-emitting elements are aligned and (2) a light-receiving side section in which a plurality of header sections for mounting thereon the light-receiving elements are aligned are connected in parallel to one another via a connecting section.

With this arrangement, the optical coupling device can be formed in such a manner that the element is mounted on the both header sections of the lead frame, the light-emitting element and the light-receiving element are superposed so as to be faced with each other by folding the connecting section, and then molding is applied.

Since the lead frame is integrated via the connecting section, the number of components can be reduced, and the lead frame can be formed (manufactured) by means of a single mold. Further, the lead frame requires only one processing and conveyance system, thereby allowing conveyance control to be easier.

Therefore, it is possible to remarkably downsize a manufacturing device and a conveyance device (of the optical coupling device) including the mold (of the lead frame) as compared to the conventional arrangement, and remarkably reduce a running cost of the manufacturing and conveyance devices, thereby drastically reducing manufacturing cost of the optical coupling device. Further, it is possible to maintain the equipment and device easier.

Incidentally, when the lead frame is formed into a hoop shape (reel shape), it is possible to consecutively place (feed) them into a line, whereas when the lead frame is formed into a lath shape, it is possible to consecutively place a large number of piles of the lath-shaped lead frames sequentially from below efficiently. This remarkably improves the work efficiency in each of the processing steps, and downsizes the processing equipment.

The present invention may be so arranged that a manufacturing method of the optical coupling device of the present invention, using a lead frame of an optical coupling device, which is mounted with a light-emitting element and a light-receiving element, wherein (1) a light-emitting side section in which a plurality of header sections for mounting the light-emitting element are aligned and (2) a light-receiving side section in which a plurality of header sections for mounting the light-receiving element are aligned are integrated via a connecting section so as to be parallel with each other, is characterized by sequentially carrying out the steps of die-bonding, wire-bonding, pre-coating, folding the lead frame at the connecting section, and molding.

With this method, the light-emitting element and the light-receiving element are bonded on each of the header sections in the die-bonding step, the light-emitting element and the light-receiving element are respectively connected to an external lead via a metal wire in the wire-bonding step, and the light-emitting element and the light-receiving element and the connecting section of the light-emitting element and the light-receiving element are coated with silicone resin, for example, for relaxing stress in the pre-coating step.

Following this, the light-emitting side section and the light-receiving side section are superposed by folding so that the light-emitting element and the light-receiving element face one another in the lead frame folding step. Then, primary molding using translucent resin (translucent epoxy resin, for example) and secondary molding using light-shielding resin (light-shielding epoxy resin, for example) are carried out in the molding step so as to complete the optical coupling device.

Throughout the whole steps as described above, since the lead frame requires only one processing and conveyance system and the conveyance control becomes easier, it is possible to remarkably downsize a manufacturing device including a conveyance device as compared to the conventional arrangement, and remarkably reduce a running cost of the manufacturing and conveyance devices, thereby significantly reducing manufacturing cost of the optical coupling device. Further, it is possible to maintain the equipment and device easier.

The present invention may be so arranged that a manufacturing method of the optical coupling device of the present invention, using a lead frame of an optical coupling device, which is mounted with a light-emitting element and a light-receiving element, wherein (1) a light-emitting side section in which a plurality of header sections for mounting the light-emitting element are aligned and (2) a light-receiving side section in which a plurality of header sections for mounting the light-receiving element are aligned are integrated via a connecting section so as to be parallel with each other, is characterized by sequentially carrying out the steps of die-bonding, wire-bonding, pre-coating, cutting the lead frame into a lath shape with a predetermined length, cutting a center of the connecting section of the lead frame as cut into the lath shape, superposing the light-emitting side section and the light-receiving side section, as cut, and molding.

With this method, the light-emitting element and the light-receiving element are bonded on each of the header sections in the die-bonding step, the light-emitting element and the light-receiving element are respectively connected to an external lead via a metal wire in the wire-bonding step, and the light-emitting element and the light-receiving element and the connecting section of the light-emitting element and the light-receiving element are coated with silicone resin, for example, for relaxing stress in the pre-coating step.

Following this, the lead frame is cut into a lath shape having a predetermined length in the lath-shape cutting step, the connecting section of the lead frame which has been cut into the lath shape is cut in the center cutting step, and the light-emitting side section and the light-receiving side section, which have been cut off, are superposed so that the light-emitting element and the light-receiving element face one another. Then, primary molding using translucent resin (translucent epoxy resin, for example) and secondary molding using light-shielding resin (light-shielding epoxy resin, for example) are carried out in the molding step so as to complete the optical coupling device.

By cutting the lead frame into a lath shape having a predetermined length in the lath-shape cutting step, in particular, it becomes easy to handle the lead frame in each of the following steps, thereby improving the work efficiency. Further, since the lead frame requires only one processing and conveyance system throughout the whole steps and the conveyance control becomes easy, it is possible to remarkably downsize a manufacturing device including a conveyance device as compared to the conventional arrangement, and remarkably reduce a running cost of the manufacturing and conveyance devices, thereby significantly reducing a manufacturing cost of the optical coupling device. Further, it is possible to maintain the equipment and device easier.

As described above, the lead frame of the optical coupling device of the present invention may be so arranged that the connecting section is provided with a folding section for facilitating folding when the light-emitting side section and the light-receiving side section are superposed by the folding.

With this arrangement, by providing the folding section at the connecting section for facilitating folding, the work efficiency significantly improves when the both sections are superposed by folding.

The connecting section is preferably provided with a sufficient margin for folding so as to superpose the light-emitting side section and the light-receiving side section without difficulty. Further, the folding section may be formed in a thin-walled shape or an opening shape, or in a groove shape, for example. By forming the folding section as described above, it is possible to surely fold the lead frame at the folding section with ease.

Further, the lead frame of the optical coupling device of the present invention may be so arranged that the connecting section is further provided with an element supply hole for picking up the light-receiving element and the light-emitting element.

With this arrangement, by providing the element supply hole at the connecting section which connects the light-emitting side section and the light-receiving side section, it is possible to mount the element on the header section with high work efficiency by picking up the element through the element supply hole formed in a vicinity of the header section. This improves work efficiency in mounting the elements.

The lead frame of the optical coupling device of the present invention may be so arranged that respective cradle sections of said light-emitting side section and said light-receiving side section and said connecting section have conveyance sprocket holes which are formed so as to be matched in a state where said light-emitting side section and said light-receiving side section are superposed.

With this arrangement, by forming the sprocket holes formed on the cradle sections and the connecting section in such a manner that respective positions of the sprocket holes are matched in the state where the light-emitting side section and the light-receiving side section are superposed, it is possible to apply the power for conveyance on the both sides of the superposed lead frame, thus ensuring conveyance of the superposed lead frame.

The manufacturing method of the optical coupling device of the present invention may be so arranged that a frame cutting step is carried out between the pre-coating step and the lead frame folding step, for cutting the superposing side section which is one of a light-emitting side section and a light-receiving side section.

With this method, by carrying out the frame cutting step between the pre-coating step and the lead frame folding step, it is possible to superpose the light-emitting side section and the light-receiving side section by folding only a required portion, thus proceeding the processing without waste in the following steps.

Alternatively, a frame cutting step may be carried out between the pre-coating step and the lead frame folding step, for cutting the superposing side section which is one of the light-emitting side section and the light-receiving side section, so as to fold only the required portion and to proceed the processing without waste in the following steps. Further, the cutting and folding processing may be carried out per unit column in the frame cutting step.

The manufacturing method of the optical coupling device of the present invention may be so arranged that a bonding step is carried out after carrying out the step of folding the lead frame, for bonding the light-emitting side section and the light-receiving side section so as to prevent the respective sections from being separated.

With this method, by bonding the light-emitting side section and the light-receiving side section, it is possible to prevent the separation of the both superposed side sections caused by the resiliency of the lead frame itself. This stably maintains accuracy of relative positions of the light-emitting element and the light-receiving element, thus realizing the product having a high quality.

The manufacturing method of the optical coupling device of the present invention may be so arranged that an upset is formed on one of the light-emitting side section and the light-receiving side section before the light-emitting side section and the light-receiving side section are faced with each other, for matching positions for pulling out a lead when the both sections are faced with each other.

With this method, the upset for matching positions for pulling out the lead is formed on one of the light-emitting side section and the light-receiving side section before arranging the both side sections so as to face one another. This eliminates the need to adjust the positions for pulling out the lead both on the light-emitting side and on the light-receiving side after the superposing. When the upset is formed with the mold, the upset can be formed while the resin is filled, thus eliminating an additional step for forming the upset.

The manufacturing method of the optical coupling device of the present invention may be so arranged that the upset is formed directly before carrying out the die-bonding step.

With this method, by forming the upset directly before carrying out the die-bonding step, it is possible to place the elements on the header sections with accuracy without being affected by the folding process, and to prevent the elements from being adversely affected by the heat as generated in the folding process, thereby stably maintaining the product quality, and improving the work efficiency.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A manufacturing method of an optical coupling device, using a lead frame, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section located between said light-emitting side section and said light-receiving side section for connecting said light-emitting side section and said light-receiving side section in parallel into one body, said method of the optical coupling device, comprising the steps of:

(a) mounting said light-emitting elements and said light-receiving elements on said lead frame so as to sandwich said connecting section; and (b) folding said lead frame along said connecting section at a folding margin so that the light-emitting side section and the light-receiving side section face one another after carrying out said step (a).

2. The manufacturing method of the optical coupling device, as set forth in claim 1, wherein:

said step (a) includes a die-bonding step, a wire-bonding step, and a pre-coating step, said method further comprising:

a molding step to be carried out after carrying out said step (b).

3. The manufacturing method of the optical coupling device as set forth in claim 1, further comprising:

a frame cutting step, to be carried out between said step (a) and said step (b), for cutting either said light-emitting side section or said light-receiving side section to be folded.

4. The manufacturing method of the optical coupling device as set forth in claim 3, wherein:

in said frame cutting step, either said light-emitting side section or said light-receiving side section to be folded is cut at least to a folding line, in a direction substantially orthogonal to a longitudinal direction.

5. The manufacturing method of the optical coupling device as set forth in claim 1, further comprising:

a bonding step to be carried out after carrying out said step (b), for bonding said light-emitting side section and said light-receiving side section so as to prevent them from being separated.

6. The manufacturing method of the optical coupling device as set forth in claim 1, further comprising the step of:

(c) forming an upset on either said light-emitting side section or said light-receiving side section, for matching pull-out positions of a lead in a state where said light-emitting side section and said light-receiving side section face one another, said step (c) being carried out before arranging said light-emitting side section and said light-receiving side section so as to face one another.

7. The manufacturing method of the optical coupling device as set forth in claim 6, wherein:

said step (a) includes a die-bonding step; and
said step (c) is carried out directly before carrying out said die-bonding step.

8. The manufacturing method of an optical coupling device, as set forth in claim 1, wherein:

said plurality of header sections in said light-emitting side section are aligned in a matrix, said light-emitting side section including a cradle connecting a plurality of rows of the matrix;

said plurality of header sections in said light-receiving side section are aligned in a matrix, said light-receiving side section including a cradle connecting a plurality of rows of the matrix; and said connecting section connects said light-emitting side section and said light-receiving side section at ends of the rows opposite to the respective cradles.

9. The manufacturing method of an optical coupling device, as set forth in claim 8, comprising the step of:

forming conveyance sprocket holes respectively in the cradles of said light-emitting side section and said light-receiving side section, said sprocket holes being formed in such a manner that respective positions of said sprocket hole of said light-emitting side section and said sprocket hole of said light-receiving side section are matched in a state where said light-emitting side section and said light-receiving side section face one another.

10. The manufacturing method of an optical coupling device, as set forth in claim 1, further including the step of:

forming a plurality of conveyance sprocket holes in said connecting section, said conveyance sprocket holes being formed in such a manner that respective position of said conveyance sprocket holes are matched in a state where said light-emitting side section and said light-receiving side section face one another.

11. A manufacturing method of an optical coupling device, using a lead frame, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section located between said light-emitting side section and said light-receiving side section for connecting said light-emitting side section and said light-receiving side section in parallel into one body, said method of the optical coupling device, comprising the steps of:

(e) mounting said light-emitting elements and said light-receiving elements on said lead frame so as to sandwich said connecting section;

(f) cutting said lead frame into a lath shape with a predetermined length in a direction substantially orthogonal to a longitudinal direction after carrying out said step (e);

(g) cutting a center of said connecting section of said lead frame as cut into the lath shape, so as to separate said light-emitting side section and said light-receiving side section from one another; and (h) superposing said light-emitting side section and said light-receiving side section, as cut in said step (g), said steps being carried out in this order.

12. The manufacturing method of the optical coupling device as set forth in claim 11, wherein:

said step (e) includes a die-bonding step, a wire-bonding step, and a pre-coating step, said method further comprising:

a molding step to be carried out after carrying out said step (h).

13. The manufacturing method of the optical coupling device as set forth in claim 11, further comprising the step of:

(i) forming an upset on either said light-emitting side section or said light-receiving side section, for matching pull-out positions of a lead in a state where said light-emitting side section and said light-receiving side section face one another, said step (i) being carried out before arranging said light-emitting side section and said light-receiving side section so as to face one another.

14. The manufacturing method of the optical coupling device as set forth in claim 13, wherein:

said step (e) includes a die-bonding step; and
said step (i) is carried out directly before carrying out said die-bonding step.

15. The manufacturing method of an optical coupling device, as set forth in claim 11, wherein:

said plurality of header sections in said light-emitting side section are aligned in a matrix, said light-emitting side section including a cradle connecting a plurality of rows of the matrix;

said plurality of header sections in said light-receiving side section are aligned in a matrix, said light-receiving side section including a cradle connecting a plurality of rows of the matrix; and said connecting section connects said light-emitting side section and said light-receiving side section at ends of the rows opposite to the respective cradles.

16. The manufacturing method of an optical coupling device, as set forth in claim 15, comprising the step of:

forming conveyance sprocket holes respectively in the cradles of said light-emitting side section and said light-receiving side section, said sprocket holes being formed in such a manner that respective positions of said sprocket hole of said light-emitting side section and said sprocket hole of said light-receiving side section are matched in a state where said light-emitting side section and said light-receiving side section face one another.

17. The manufacturing method of an optical coupling device, as set forth in claim 11, wherein:

said plurality of header sections in said light-emitting side section are aligned in a matrix, said light-emitting side section including a cradle connecting a plurality of rows of the matrix;

said plurality of header sections in said light-receiving side section are aligned in a matrix, said light-receiving side section including a cradle connecting a plurality of rows of the matrix; and said connecting section connects said light-emitting side section and said light-receiving side section at ends of the rows opposite to the respective cradles.

18. A manufacturing method of an optical coupling device, using a lead frame of an optical coupling device, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section located between said light-emitting side section and said light-receiving side section for connecting said light-emitting side section and said light-receiving side section in parallel into one body, said manufacturing method of the optical coupling device, comprising the steps of:

die-bonding;

wire-bonding;

pre-coating;

folding said lead frame along said connecting section at a folding margin so that the light-emitting side section and the light-receiving side section face one another; and molding, said steps being carried out in this order.

19. A manufacturing method of an optical coupling device, using a lead frame of an optical coupling device, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section located between said light-emitting side section and said light-receiving side section for connecting said light-emitting side section and said light-receiving side section in parallel into one body, said manufacturing method of the optical coupling device, comprising the steps of:

die-bonding;

wire-bonding;

pre-coating;

cutting a said lead frame into a lath shape with a predetermined length;

cutting a center of said connecting section of said lead frame as cut into the lath, so as to separate said light-emitting side section and said light-receiving side section from one another;

superposing said light-emitting side section and said light-receiving side section, as cut; and molding.

20. A manufacturing method of an optical coupling device, using a lead frame of an optical coupling device, which is provided with (1) a light-emitting side section in which a plurality of header sections for mounting thereon light-emitting elements are aligned, (2) a light-receiving side section in which a plurality of header sections for mounting thereon light-receiving elements are aligned, and (3) a connecting section located between said light-emitting side section and said light-receiving side section for connecting said light-emitting side section and said light-receiving side section in parallel into one body, said manufacturing method of the optical coupling device, comprising the steps of:

folding said connecting section along said connecting section at a folding margin so that said light-emitting elements and said light-receiving elements face one another.

21. A manufacturing method of an optical coupling device, using a lead frame, which is provided with (1) a light-emitting side section including a plurality of header section for mounting thereon light-emitting elements, and (2) a light-receiving side section inducing a plurality of header sections for mounting thereon light-receiving elements, comprising the steps of:

(j) mounting said light-emitting elements and said light-receiving elements on said lead frame; and (k) folding said lead frame along a folding margin located between said light-emitting side section and said light-receiving side section so that said light-emitting elements and said light-receiving elements face one another, after carrying out said step (j).

22. The manufacturing method of an optical coupling device, as set forth in claim 21, wherein:

said folding margin is in a longitudinal direction of said lead frame.

23. The manufacturing method of an optical coupling device, as set forth in claim 21, wherein:

said plurality of header sections in the light-emitting side section are aligned in a matrix, and said plurality of header sections in the lights-receiving side section are aligned in a matrix.

* * * * *